United States Patent
Matsunaga et al.

(10) Patent No.: US 8,563,096 B2
(45) Date of Patent: *Oct. 22, 2013

(54) VERTICAL FILM FORMATION APPARATUS AND METHOD FOR USING SAME

(75) Inventors: Masanobu Matsunaga, Nirasaki (JP); Pao-Hwa Chou, Nirasaki (JP); Masato Yonezawa, Nirasaki (JP); Masayuki Hasegawa, Nirasaki (JP); Kazuhide Hasebe, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 220 days.

This patent is subject to a terminal disclaimer.

(21) Appl. No.: 12/954,767

(22) Filed: Nov. 26, 2010

(65) Prior Publication Data

US 2011/0129618 A1    Jun. 2, 2011

(30) Foreign Application Priority Data

Nov. 27, 2009 (JP) .................................. 2009-269830
Oct. 28, 2010 (JP) .................................. 2010-241831

(51) Int. Cl.
*C23C 16/02* (2006.01)
*H05H 1/24* (2006.01)

(52) U.S. Cl.
USPC ........................... 427/579; 427/569; 427/578

(58) Field of Classification Search
None
See application file for complete search history.

(56) References Cited

U.S. PATENT DOCUMENTS

| | | |
|---|---|---|
| 2001/0041250 A1 | 11/2001 | Werkhoven et al. |
| 2004/0256664 A1 | 12/2004 | Chou et al. |
| 2005/0066993 A1* | 3/2005 | Hasebe et al. .................... 134/1 |
| 2005/0085098 A1* | 4/2005 | Timmermans et al. ........ 438/794 |
| 2008/0311760 A1 | 12/2008 | Nodera et al. |
| 2009/0074984 A1* | 3/2009 | Shimizu et al. ............... 427/569 |
| 2009/0114156 A1 | 5/2009 | Nodera et al. |

FOREIGN PATENT DOCUMENTS

| | | |
|---|---|---|
| JP | A-2006-49809 | 2/2006 |
| JP | 2006-059921 | 3/2006 |
| JP | 2009-026934 | 2/2009 |
| JP | 2009-076586 | 4/2009 |
| WO | WO 2004/044970 A1 | 5/2004 |
| WO | WO 2007/111348 A1 | 10/2007 |

OTHER PUBLICATIONS

Office Action mailed on Mar. 19, 2013, in Japanese Patent Application No. 2010-241831.

* cited by examiner

*Primary Examiner* — Joseph Miller, Jr.
(74) *Attorney, Agent, or Firm* — Oblon, Spivak, McClelland, Maier & Neustadt, L.L.P.

(57) ABSTRACT

A method for using a vertical film formation apparatus includes performing a coating process inside the process container without product target objects present therein to cover an inner surface of the process container with a coating film, and then performing a film formation process inside the process container accommodating the holder with the product target objects placed thereon to form a predetermined film on the product target objects. The coating process alternately supplies the first and second process gases into the process container without turning either of the first and second process gases into plasma. The film formation process alternately supplies the first and second process gases into the process container while turning at least one of the first and second process gases into plasma.

13 Claims, 7 Drawing Sheets

VERTICAL FILM FORMATION APPARATUS AND METHOD FOR USING SAME

CROSS-REFERENCE TO RELATED PATENT APPLICATIONS

This application claims the benefit of priority from Japanese Patent Applications No. 2009-269830, filed on Nov. 27, 2009, and No. 2010-241831, filed on Oct. 28, 2010, in the Japan Patent Office, the disclosure of which is incorporated herein in the entirety by reference.

BACKGROUND OF THE INVENTION

1. Field of the Invention

The present invention relates to a vertical film formation apparatus of the batch type for forming a thin film, such as a silicon nitride film (SiN film) on target objects, such as semiconductor wafers, and a method for using the same, and particularly relates to a semiconductor process technique for inhibiting metal contamination inside the process container. The term "semiconductor process" used herein includes various kinds of processes which are performed to manufacture a semiconductor device or a structure having wiring layers, electrodes, and the like to be connected to a semiconductor device, on a target object, such as a semiconductor wafer or a glass substrate used for an FPD (Flat Panel Display), e.g., an LCD (Liquid Crystal Display), by forming semiconductor layers, insulating layers, and conductive layers in predetermined patterns on the target object.

2. Description of the Related Art

In the manufacturing sequence of semiconductor devices, there is used a film formation process for forming a thin film, such as a silicon nitride film, on a semiconductor wafer, such as a silicon wafer. In such film formation processes, a vertical heat processing apparatus of the batch type is often used to perform film formation by chemical vapor deposition (CVD) on a plurality of semiconductor wafers together at a time.

In recent years, owing to the demands for increased miniaturization and integration of semiconductor devices, it has been required to form a thin film of higher quality, such as a silicon nitride film. As a technique for fulfilling the demands to form a thin film of higher quality, there has been proposed a technique for forming an SiN film by ALD (atomic layer deposition) that alternately supplies an Si source gas and a nitriding gas to repeat lamination of films of an atomic layer level or molecular layer level. For example, dichlorosilane (DCS: $SiH_2Cl_2$), which has a high adsorbent property, is used as the Si source, and ammonia ($NH_3$) is used as the nitriding gas while being turned into plasma.

In vertical heat processing apparatuses of the batch type, the process container, wafer boat, and so forth are made of quartz. After a film formation process is repeated, a cleaning is performed to remove reaction products, and then a coating process is performed to cover the inner surface of the process container, the surface of the wafer boat, and so forth with a coating film made of the same material as the product film (which means the product film formed on wafers by the film formation process). This is conceived to prevent particles and contaminants, such as Na, from scattering from theses members (made of quartz) and contaminating the product film. Conventionally, in film formation apparatuses for forming a product film by plasma ALD, a coating process of this kind is also performed by plasma ALD to simplify the control and increase the yield (International Publication No. WO 2004/044970 (Patent Document 1)).

However, where the technique disclosed in the Patent Document 1 is used, it is difficult to satisfy requirements for the Na contamination caused on the product film, which is formed by the film formation process after the coating process, although the requirements are increasingly stricter. In order to solve this problem, there has been proposed a technique for performing the coating process by thermal CVD that simultaneously supplies DCS gas and $NH_3$ gas without utilizing plasma (International Publication No. WO 2007/111348 (Patent Document 2)).

BRIEF SUMMARY OF THE INVENTION

However, it has been found by the present inventors that, where the coating process is performed by thermal CVD, the thickness of the coating film is insufficient at lower temperature portions, such as portions near the bottom, inside the process container, and thus cannot sufficiently prevent the Na contamination. In this case, at portions with the thin coating film, quartz members inside the process container are sputtered by plasma during the film formation process, and emit contaminants, such as Na.

An object of the present invention is to provide a vertical film formation apparatus of the batch type and a method for using the same, which can stably decrease the Na concentration in the product film formed by plasma ALD.

According to a first aspect of the present invention, there is provided a method for using a vertical film formation apparatus, the film formation apparatus comprising a vertical process container configured to hold a vacuum state therein, a holder configured to hold a plurality of target objects at intervals in a vertical direction inside a process container, a heater disposed around the process container to heat the target objects, a first process gas supply system configured to supply a first process gas into the process container, a second process gas supply system configured to supply a second process gas into the process container, a plasma generation system attached to the process container and configured to turn gas into plasma, and an exhaust system configured to exhaust gas from inside the process container, the method comprising: performing a coating process inside the process container without product target objects present therein to cover an inner surface of the process container with a coating film, by setting temperature inside the process container at a coating temperature, and alternately supplying the first and second process gases into the process container without turning either of the first and second process gases into plasma by the plasma generation system, to form the coating film by a reaction between the first and second process gases; and then, performing a film formation process inside the process container accommodating the holder with the product target objects placed thereon to form a predetermined film on the product target objects, by setting temperature inside the process container at a film formation temperature lower than the coating temperature and alternately supplying the first and second process gases into the process container while turning at least one of the first and second process gases into plasma by the plasma generation system, to form the predetermined film by a reaction between the first and second process gases.

According to a second aspect of the present invention, there is provided a vertical film formation apparatus comprising: a vertical process container configured to hold a vacuum state therein; a holder configured to hold a plurality of target objects at intervals in a vertical direction inside a process container; a heater disposed around the process container to heat the target objects; a first process gas supply system configured to supply a first process gas into the process container; a second process gas supply system configured to supply a second process gas into the process container; a plasma generation system attached to the process container and configured to turn gas into plasma; an exhaust system configured to exhaust gas from inside the process container; and a control section configured to control an operation of the apparatus, wherein the control section is preset to perform a sequence, which comprises performing a coating process inside the process container without product target objects present therein to cover an inner surface of the process container with a coating film, by setting temperature inside the process container at a coating temperature, and alternately supplying the first and second process gases into the process container without turning either of the first and second process gases into plasma by the plasma generation system, to form the coating film by a reaction between the first and second process gases, and then, performing a film formation process inside the process container accommodating the holder with the product target objects placed thereon to form a predetermined film on the product target objects, by setting temperature inside the process container at a film formation temperature lower than the coating temperature and alternately supplying the first and second process gases into the process container while turning at least one of the first and second process gases into plasma by the plasma generation system, to form the predetermined film by a reaction between the first and second process gases.

According to a third aspect of the present invention, there is provided a computer readable non-transitory storage medium containing a program for execution on a computer, which is used for a vertical film formation apparatus, wherein the program, when executed by the computer, causes the computer to control the vertical film formation apparatus to conduct a method according to the first aspect.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Figure 1:
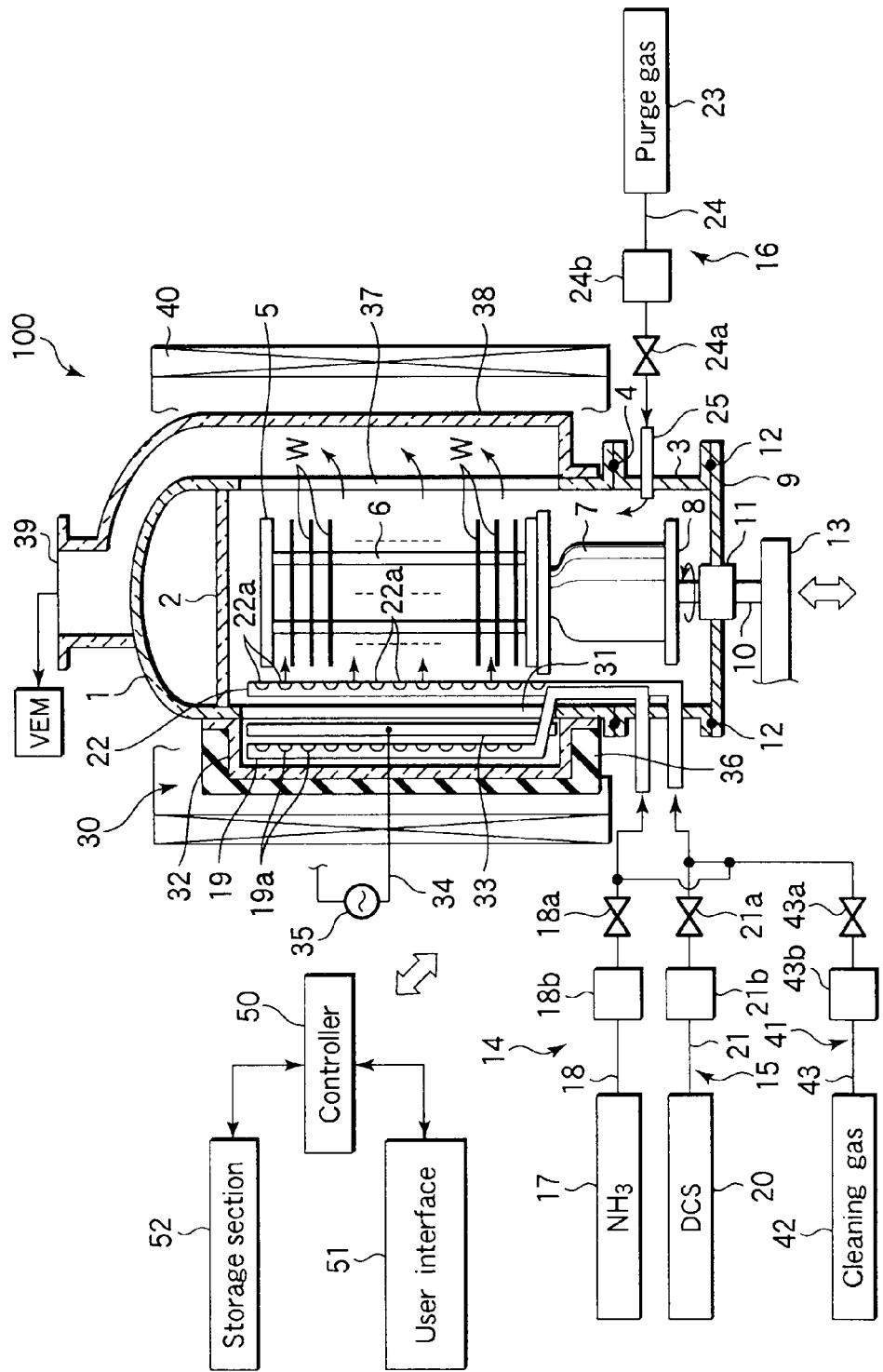
FIG. 1 is a sectional front view showing a vertical film formation apparatus of the batch type for a semiconductor process according to an embodiment of the present invention.

An embodiment of the present invention will now be described with reference to the accompanying drawings. In the following description, the constituent elements having substantially the same function and arrangement are denoted by the same reference numerals, and a repetitive description will be made only when necessary.

Figure 2:
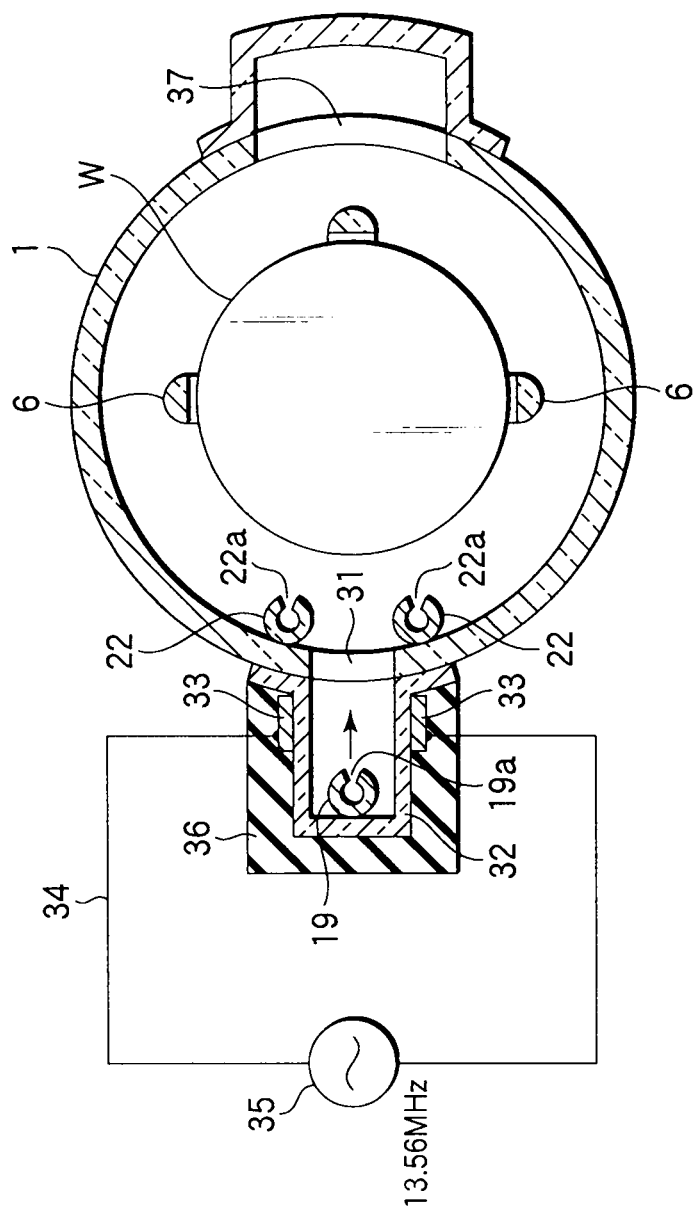
FIG. 2 is a sectional plan view showing part of the film formation apparatus shown in FIG. 1.

FIG. 1 is a sectional front view showing a vertical film formation apparatus of the batch type for a semiconductor process according to an embodiment of the present invention. FIG. 2 is a sectional plan view showing part of the film formation apparatus shown in FIG. 1. In FIG. 2, a heating mechanism is not shown.

The film formation apparatus 100 includes a process container 1 shaped as a cylindrical column with an opened bottom and closed top. The entirety of the process container 1 is made of, e.g., quartz. The process container 1 is equipped with a quartz ceiling plate 2 disposed therein near the top to airtightly seal the area below the ceiling plate 2. The opened bottom of the process container 1 is connected through a seal member 4, such as an O-ring, to a cylindrical manifold 3 made of, e.g., stainless steel.

The manifold 3 supports the bottom of the process container 1. A wafer boat 5 made of quartz is moved up and down through the bottom port of the manifold 3, so that the wafer boat 5 is loaded/unloaded into and from the process container 1. A number of, such as about 50 to 100, target objects or semiconductor wafers W are stacked on a wafer boat 5. The wafer boat 5 has three struts 6 (see FIG. 2) with grooves on which a number of wafers W are respectively supported.

The wafer boat 5 is placed on a table 8 through a heat-insulating cylinder 7 made of quartz. The table 8 is supported by a rotary shaft 10, which penetrates a lid 9 made of, e.g., stainless steel, and used for opening/closing the bottom port of the manifold 3.

The portion of the lid 9 where the rotary shaft 10 penetrates is equipped with, e.g., a magnetic-fluid seal 11, so that the rotary shaft 10 is rotatably supported in an airtightly sealed state. A seal member 12, such as an O-ring, is interposed between the periphery of the lid 9 and the bottom of the manifold 3, so that the interior of the process container 1 can be kept sealed.

For example, the rotary shaft 10 is attached at the distal end of an arm 13 supported by an elevating mechanism (not shown), such as a boat elevator. The elevating mechanism moves the wafer boat 5 and lid 9 up and down in unison into and from the process container 1. The table 8 may be fixed to the lid 9, so that wafers W are processed without rotation of the wafer boat 5.

The film formation apparatus 100 includes a nitrogen-containing gas supply mechanism 14, an Si source gas supply mechanism 15, a purge gas supply mechanism 16, and a cleaning gas supply mechanism 41. The nitrogen-containing gas supply mechanism 14 is arranged to supply a nitrogen-containing gas, such as ammonia ($NH_3$) gas, into the process container 1. The Si source gas supply mechanism 15 is arranged to supply an Si source gas, such as dichlorosilane (DCS) gas, into the process container 1. The purge gas supply mechanism 16 is arranged to supply an inactive gas, such as nitrogen ($N_2$) gas, serving as a purge gas into the process container 1. The cleaning gas supply mechanism 41 is arranged to supply a cleaning gas, such as a fluorine-containing gas, e.g., HF gas or $F_2$ gas, into the process container 1.

The nitrogen-containing gas supply mechanism 14 includes a nitrogen-containing gas supply source 17 and a gas distribution nozzle 19 connected to each other through a gas line 18 for supplying the nitrogen-containing gas. The gas distribution nozzle 19 is formed of a quartz pipe that penetrates the sidewall of the manifold 3 from outside and then turns and extends vertically upward. The vertical portion of the gas distribution nozzle 19 has a plurality of gas spouting holes 19a formed thereon at predetermined intervals over the vertical length corresponding to the wafer supporting span of the wafer boat 5. Consequently, the nitrogen-containing gas, such as $NH_3$ gas, is almost uniformly spouted in horizontal directions from the gas spouting holes 19a toward the process container 1.

The Si source gas supply mechanism 15 includes an Si source gas supply source 20 and a gas distribution nozzles 22 connected to each other through a gas line 21 for supplying the Si source gas. In this embodiment, there are two gas distribution nozzles 22 for the Si source gas (see FIG. 2). Each of the gas distribution nozzles 22 is formed of a quartz pipe that penetrates the sidewall of the manifold 3 from outside and then turns and extends vertically upward. The vertical portion of each of the gas distribution nozzles 22 also has a plurality of gas spouting holes 22a formed thereon at predetermined intervals over the vertical length corresponding to the wafer supporting span of the wafer boat 5. Consequently, the Si source gas, such as DCS gas, is almost uniformly spouted in horizontal directions from the gas spouting holes 22a toward the process container 1. Only one gas distribution nozzle 22 may be disposed for the Si source gas.

The purge gas supply mechanism 16 includes a purge gas supply source 23 and a gas nozzle 25 connected to each other through a gas line 24 for supplying the purge gas. The gas nozzle 25 is formed of a short quartz pipe that penetrates the sidewall of the manifold 3 from outside. An inactive gas, such as $N_2$ gas, is preferably used as the purge gas.

The cleaning gas supply mechanism 41 includes a gas supply source 42 of the cleaning gas and a gas line 43 extending from the gas supply source 42. The gas line 43 forks on the way to two lines connected to the gas line 18 and gas line 21.

The gas lines 18, 21, 24, and 43 are respectively equipped with switching valves 18a, 21a, 24a, and 43a and flow rate controllers 18b, 21b, 24b, and 43b, such as mass flow controllers. Consequently, the nitrogen-containing gas, Si source gas, purge gas, and cleaning gas can be supplied at controlled flow rates.

A plasma generating mechanism 30 is formed on a part of the sidewall of the process container 1 for generating plasma of the nitrogen-containing gas serving as a nitriding gas. The plasma generating mechanism 30 has a vertically long narrow opening 31 formed by cutting a predetermined width of the sidewall of the process container 1 in the vertical direction. The opening 31 is covered with a plasma cover wall 32 airtightly connected to the outer surface of the process container 1 by welding. The plasma cover wall 32 is formed of, e.g., quartz and has a vertical long narrow shape with a concave cross-section.

A pair of long narrow plasma electrodes 33 are disposed on the opposite outer surfaces of the plasma cover wall 32, and face each other while extending in the vertical direction. The plasma electrodes 33 are connected to an RF (Radio Frequency) power supply 35 for supplying an RF power through feed lines 34. An RF voltage of, e.g., 13.56 MHz is applied from the power supply 35 to the plasma electrodes 33 to generate plasma of the nitrogen-containing gas. The frequency of the RF voltage is not limited to 13.56 MHz, and it may be set at another frequency, e.g., 400 kHz.

The plasma cover wall 32 described above is formed such that the sidewall of the process container 1 projects outward to define an inner concave, while the inner space of the plasma cover wall 32 communicates with the inner space of the process container 1. The inner space of the plasma cover wall 32 and the opening 31 have a vertical length sufficient to cover all the wafers W on the wafer boat 5 in the vertical direction.

The gas distribution nozzle 19 for the nitrogen-containing gas is bent outward in the radial direction of the process container 1 while it extends upward inside the process container 1. Then, the gas distribution nozzle 19 vertically extends at the deepest position (the farthest position from the center of the process container 1) inside the plasma cover wall 32. For example, when the RF power supply 35 is turned on and an RF electric field is thereby generated between the two electrodes 33, the nitrogen-containing gas, such as $NH_3$ gas, spouted from the gas spouting holes 19a of the gas distribution nozzle 19 is turned into plasma and is supplied and diffused toward the center of the process container 1.

An insulating protection cover 36 made of, e.g., quartz is attached on and covers the outer surface of the plasma cover wall 32. A coolant passages (not shown) are formed inside the insulating protection cover 36 and can be supplied with a coolant, such as cooled nitrogen gas, to cool the plasma electrodes 33.

The two gas distribution nozzles 22 extend upward at the opposite positions sandwiching the opening 31 inside the sidewall of the process container 1. The Si source gas, such as DCS gas, is spouted from the gas spouting holes 22a of the gas distribution nozzles 22 toward the center of the process container 1.

On the other hand, on the side of the process container 1 opposite to the opening 31, the process container 1 has an exhaust port 37 formed thereon for vacuum-exhausting the interior of the process container 1. The exhaust port 37 has a long narrow shape formed by cutting the sidewall of the process container 1 in the vertical direction. The exhaust port 37 is covered with an exhaust port cover member 38 having a U-shape cross-section and attached to the process container 1 by welding. The exhaust port cover member 38 extends upward along the sidewall of the process container 1, and has a gas outlet 39 at the top of the process container 1. The gas outlet 39 is connected to a vacuum-exhaust mechanism VEM including a vacuum pump and so forth. The process container 1 is surrounded by a cylindrical heating mechanism 40 for heating the atmosphere and wafers W inside the process container 1.

The film formation apparatus 100 includes a controller 50 comprising a microprocessor (computer), which controls the respective components in the film formation apparatus 100. For example, the controller 50 controls the valves 18a, 21a, 24a, and 43a to supply/stop the gases by opening/closing them, the mass flow controllers 18b, 21b, 24b, and 43b to adjust the flow rates of the gases, the vacuum-exhaust mechanism to exhaust gas, the RF power supply 35 to turn on/off an RF power, and the heating mechanism 40 to adjust the temperature of the wafers W. The controller 50 is connected to the user interface 51, which includes, e.g., a keyboard and a display, wherein the keyboard is used for an operator to input commands for operating the film formation apparatus 100, and the display is used for showing visualized images of the operational status of the film formation apparatus 100.

Further, the controller 50 is connected to a storage section 52 that stores recipes, i.e., control programs for the controller 50 to control the film formation apparatus 100 so as to perform various processes, and control programs for the respective components of the film formation apparatus 100 to perform processes in accordance with process conditions. The recipes are stored in a storage medium included in the storage section 52. The storage medium may be formed of a medium of the stationary type, such as a hard disk or semiconductor memory, or a medium of the portable type, such as a CD-ROM, DVD, or flash memory. Alternatively, the recipes may be used online while they are transmitted from another apparatus through, e.g., a dedicated line, as needed.

A required recipe is retrieved from the storage section 52 and executed by the controller 50 in accordance with an instruction or the like input through the user interface 51. Consequently, the film formation apparatus 100 can perform a predetermined process in accordance with the retrieved recipe under the control of the controller 50.

Figure 3:
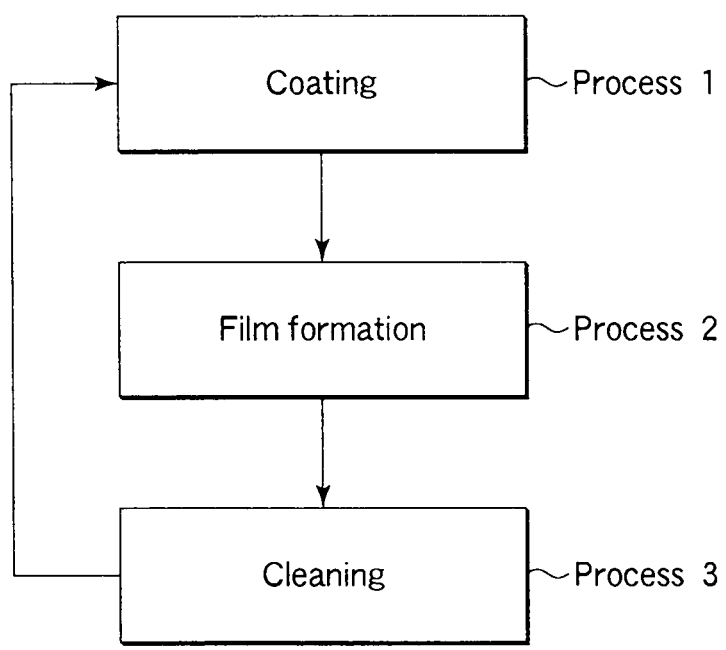
FIG. 3 is a flow chart showing a method for using the apparatus according to an embodiment of the present invention.
Figure 4:
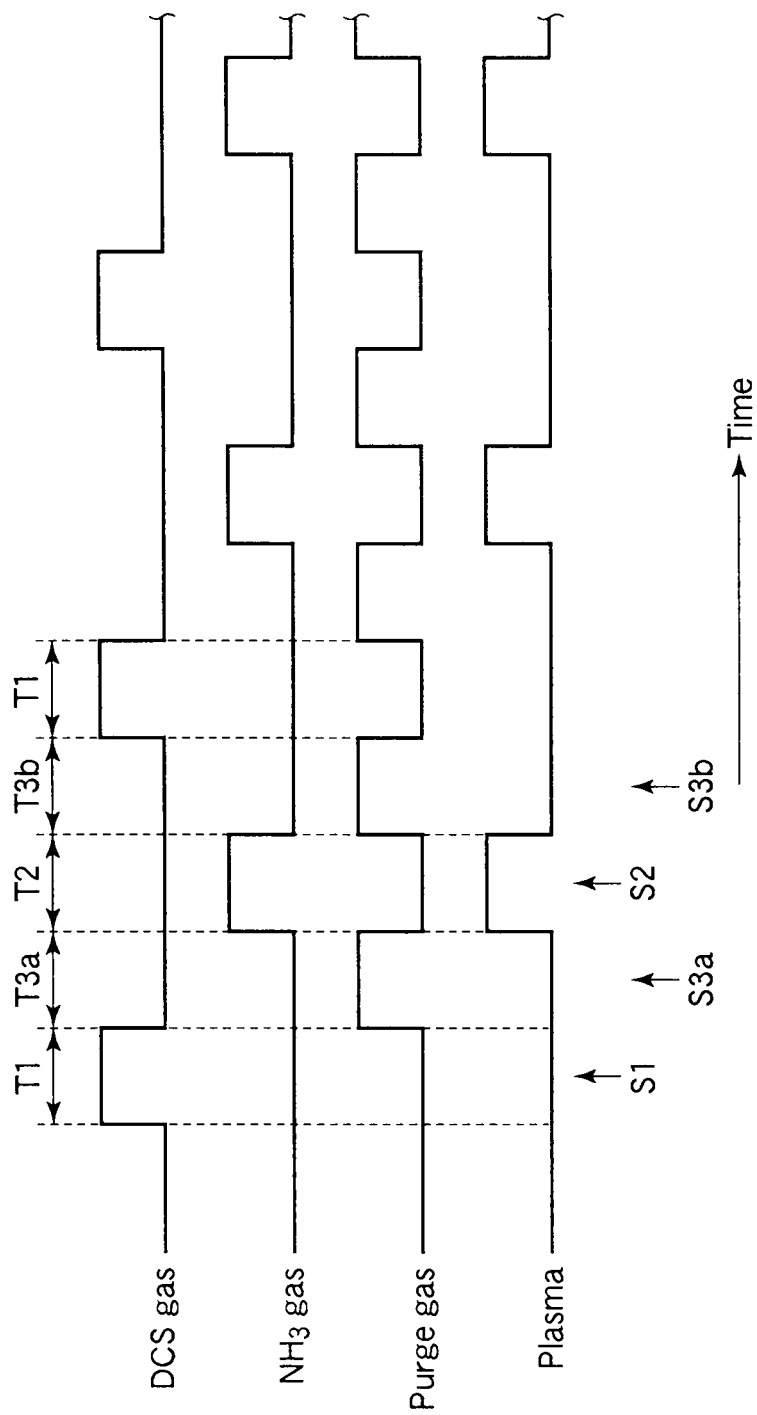
FIG. 4 is a timing chart showing the gas supply timing of a film formation process incorporated in the method of FIG. 3.
Figure 5:
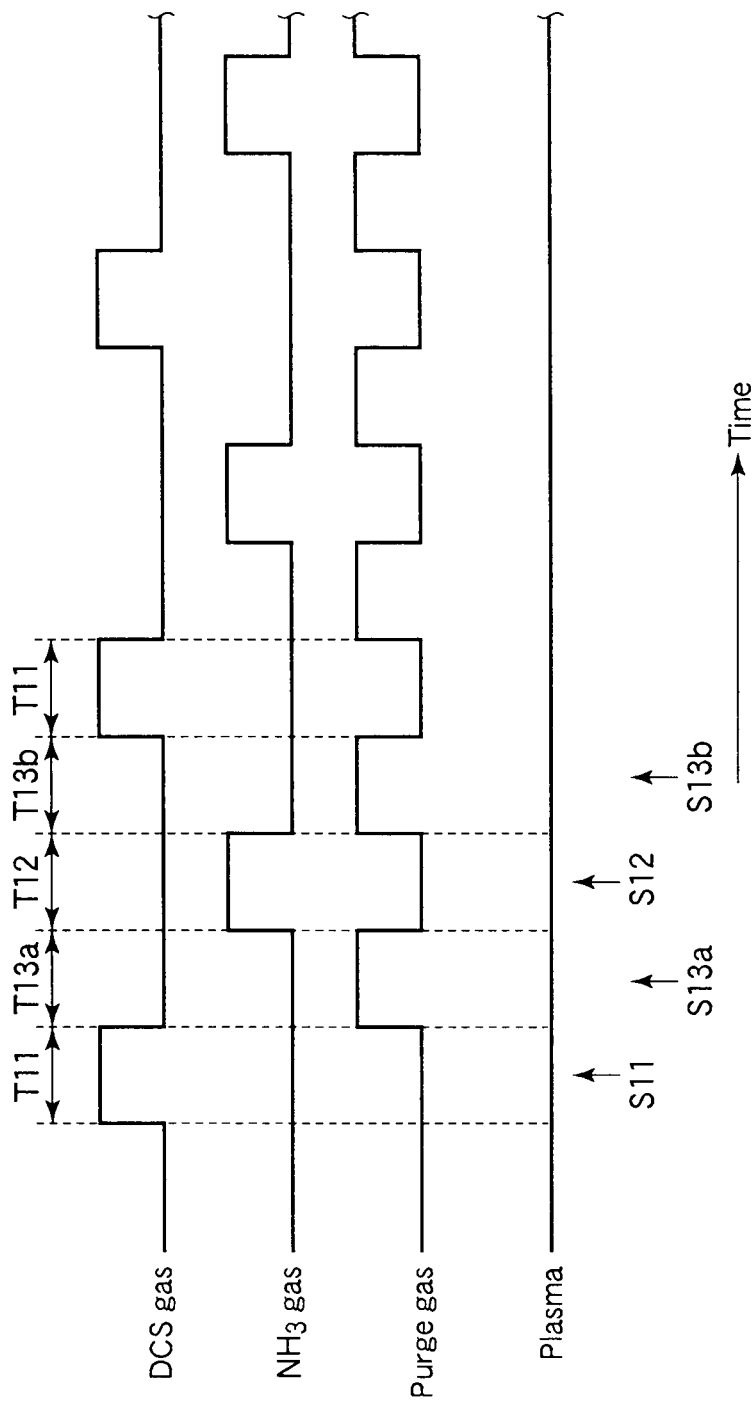
FIG. 5 is a timing chart showing the gas supply timing of a coating process incorporated in the method of FIG. 3.

Next, an explanation will be given of a method for using the apparatus according to an embodiment performed in the film formation apparatus having the structure described above. FIG. 3 is a flow chart showing a method for using the apparatus according to an embodiment of the present invention. FIG. 4 is a timing chart showing the gas supply timing of a film formation process incorporated in the method of FIG. 3. FIG. 5 is a timing chart showing the gas supply timing of a coating process incorporated in the method of FIG. 3.

In this embodiment, a coating process (process 1) prior to a film formation process, the film formation process (process 2) for forming an SiN film on wafers, and a cleaning process (process 3) following the film formation process are repeatedly performed in order.

The coating process or process 1 is used to prevent quartz members, such as process container 1, wafer boat 5, and heat-insulating cylinder 7, from scattering particles and contaminants onto the wafer W being processed. In the coating process, the wafer boat 5 without product wafers supported thereon is placed on the heat-insulating cylinder 7 and is loaded from below into the process container 1 heated at a predetermined temperature. Then, the bottom port of the manifold 3 is closed by the lid 9 to set an airtight space inside the process container 1. Then, an SiN coating film is formed on the surface of process container 1, wafer boat 5, heat-insulating cylinder 7, and gas distribution nozzles 19 and 22 by thermal ALD using no plasma as described later. This process may employ almost the same conditions as the film formation process or process 2 described below, except that no plasma is used and the temperature inside the process container 1 is higher. The coating process may be performed with dummy wafers placed on the wafer boat 5.

In the film formation process or process 2, a number of, such as 50 to 100, wafers W are placed at room temperature on the wafer boat 5 covered with the coating film. Then, the wafer boat 5 with the wafers W placed thereon is loaded from below into the process container 1 adjusted at a predetermined temperature in advance. Then, the bottom port of the manifold 3 is closed by the lid 9 to set an airtight space inside the process container 1. For example, the wafers W have a diameter of 300 mm, although not limited thereto.

Then, the interior of the process container 1 is vacuum-exhausted and kept at a predetermined process pressure. Further, the electric power applied to the heating mechanism 40 is controlled to increase and set the wafer temperature to a process temperature. Then, while the wafer boat 5 is rotated, the film formation process is started.

As shown in FIG. 4, this film formation process is performed by so-called plasma ALD that alternately repeats a step S1 and a step S2. The step S1 is arranged to supply the Si source gas, such as DCS gas, into the process container 1 to adsorb this gas on the wafers W. The step S2 is arranged to supply the nitriding gas or nitrogen-containing gas, such as $NH_3$ gas, excited by plasma into the process container 1 to nitride the Si source gas adsorbed on the wafers W. Steps S3a and S3b are interposed between the steps 1 and 2 to remove residual gas from inside the process container 1.

Specifically, in the step S1, the Si source gas, such as DCS gas, is supplied from the gas supply source 20 of the Si source gas supply mechanism 15 through the gas line 21 and gas distribution nozzles 22 and is spouted from the gas spouting holes 22a into the process container 1 for a time period T. Consequently, the Si source gas is adsorbed on each of the semiconductor wafers. The time period T1 of this step is set to be, e.g., 2 to 30 sec. The flow rate of the Si source gas is set to be, e.g., 1 to 5 L/min (slm) for DCS. The pressure inside the process container 1 is set to be, e.g., 66.65 to 666.5 Pa (0.5 to 5 Torr), and preferably to be 266.6 to 600 Pa (2 to 4.5 Torr).

The Si source gas may be a silane family gas other than DCS (dichlorosilane), such as monochlorosilane (MCS), hexachlorodisilane (HCD), monosilane ($SiH_4$), disilane ($Si_2H_6$), hexamethyldisilazane (HMDS), tetrachlorosilane (TCS), disilylamine (DSA), trisilylamine (TSA), or bister-tialbutylaminosilane (BTBAS).

In the step S2, the nitrogen-containing gas, such as $NH_3$ gas, is supplied from the gas supply source 17 of the nitrogen-containing gas supply mechanism 14 through the gas supply line 18 and gas distribution nozzle 19 and is spouted from the gas spouting holes 19a. At this time, the RF power supply 35 of the plasma generating mechanism 30 is set in the ON-state to generate an RF electric field, by which the nitrogen-containing gas, such as $NH_3$ gas, is turned into plasma. The nitrogen-containing gas thus plasma-excited is then supplied into the process container 1. Consequently, the DCS adsorbed on the semiconductor wafers W is nitrided and turned into SiN. The time period T2 of this step is set to be, e.g., 5 to 120 sec. The flow rate of the nitrogen-containing gas is set to be, e.g., 0.5 to 10 L/min (slm) for $NH_3$ gas, although it depends on the number of semiconductor wafers W supported on the wafer boat 5. The RF power supply 35 is set to apply an RF power with, e.g., a frequency of 13.56 MHz, and a power of 5 to 1,000 W, and preferably of 10 to 200 W, although they are not limited to specific values. The pressure inside the process container 1 is set to be, e.g., 13.33 to 266.6 Pa (0.1 to 2 Torr), and preferably to be 13.33 to 120 Pa (0.1 to 0.93 Torr).

In this step, the nitrogen-containing gas may be $N_2$ gas or $N_2H_4$ gas in place of $NH_3$ gas, and this alternative gas is also turned into plasma by the RF electric field when used as a nitriding agent.

The steps S3a and S3b interposed between the step S1 and step S2 are used to remove the residual gas from inside the process container 1 after the step S1 or step S2, to cause a desired reaction in the subsequent step. Specifically, in these steps, while the process container 1 is vacuum-exhausted, an inactive gas, such as $N_2$ gas, serving as a purge gas is supplied from the gas supply source 23 of the purge gas supply mechanism 16 through gas line 24 and gas nozzle 25 into the process container 1. The each of the time periods T3a and T3b of these steps S3a and S3b is set to be, e.g., 2 to 15 sec. The flow rate of the purge gas is set to be, e.g., 0.5 to 15 L/min (slm). Each of the steps S3a and S3b may be arranged to continuously vacuum-exhaust the process container 1 without supplying the purge gas, i.e., without performing the supply of any of the gases, if the residual gas can be removed from inside the process container 1. However, supplying the purge gas shortens the time necessary for removing the residual gas from inside the process container 1.

As described above, the step S1 of supplying the Si source gas, such as DCS gas, and the step S2 of supplying nitrogen-containing gas excited by plasma are alternately repeated with the steps S3a and S3b of removing the residual gas from inside the process container 1 interposed therebetween. Consequently, thin SiN layers are repeatedly laminated one by one to complete a SiN film having a predetermined thickness. The number of repetition of this cycle is suitably determined in accordance with the thickness of the completed SiN film.

The wafer temperature (film formation temperature) used in the film formation is determined to form a sound film by plasma ALD, and is set to fall within a range of 150 to 650° C., preferably of 350 to 650° C., and more preferably of 350 to 630° C., where DCS gas is used.

After the film formation process described above is repeated for a predetermined number of batches of wafers W, the cleaning process or process 3 is performed. In the cleaning process, the wafer boat 5 without product wafers supported thereon is placed on the heat-insulating cylinder 7 and is loaded from below into the process container 1 heated at a predetermined temperature. Then, the bottom port of the manifold 3 is closed by the lid 9 to set an airtight space inside the process container 1. Then, a cleaning gas, such as a fluorine-containing gas, e.g., HF gas or $F_2$ gas, is supplied from the cleaning gas supply source 42 through the gas lines 43, 18, and 21 and gas distribution nozzles 19 and 22 into the process container 1 while the interior of the process container 1 is vacuum-exhausted. This cleaning process removes reaction products deposited on the inner surface of the process container 1, wafer boat 5, heat-insulating cylinder 7, and gas distribution nozzles 19 and 22. The temperature inside the process container 1 during the cleaning process is preferably set to be 300 to 500° C., and more preferably to be 300 to 450° C.

After the cleaning process or process 3 is performed, the coating process or process 1 is performed as described previously, and then the film formation process or process 2 is performed to form an SiN film on wafers W.

Conventionally, in film formation apparatuses for forming a product film by plasma ALD, a coating process of this kind is also performed by plasma ALD, because of the following reasons. Specifically, where the coating process employs the same conditions as the film formation process, it is possible to simplify the control of the apparatus. Plasma ALD can provide a high cycle rate (film formation rate) and thus can shorten the time necessary for forming the coating film, thereby improving the use efficiency of the apparatus. The coating film needs to have a thickness of at least 50 nm to prevent contamination on the product film.

However, where the coating process is performed by plasma ALD, the Na content is relatively high in the product film formed by the film formation process after the coating process. Although the source and mechanism for generating Na in this case have not been clarified, it seems that quartz members, such as the process container 1, wafer boat 5, and heat-insulating cylinder 7, are sputtered by plasma. Na emitted from the matrix or uppermost surface of the quartz members by this sputtering remains on the coating film and is scattered onto wafers W inside process container 1 during the film formation process.

On the other hand, where the coating process is performed by thermal CVD, the Na content in the product film is decreased because of no plasma used in the coating process. However, the Na content in the product film is higher on wafers W near the bottom of the wafer boat 1. This is because the coating film formed by thermal CVD cannot have a sufficient thickness overall inside the process container 1. For example, the thickness of the coating film is smaller near the bottom inside the process container 1, and quartz members near the bottom are sputtered by plasma and generate Na during the film formation process.

According to the embodiment made in light of this problem, the coating process or process 1 is performed by thermal ALD using no plasma. The process conditions employed in this thermal ALD, such as the flow rates and supply times of the Si source gas (DCS) and nitriding gas ($NH_3$), are determined in advance, based on, e.g., the content of Na contained as a contaminant in the SiN product film on wafers W, wherein the Na is generated from the process container 1, wafer boat 5, and heat-insulating cylinder 7, as described above.

Conventionally, it is thought essential that SiN film ALD utilizes plasma to excite a nitrogen-containing gas, such as $NH_3$ gas, when supplying the gas. However, according to the present invention, it has been found that the coating process does not necessarily require plasma but a suitably controlled temperature to form a coating film that provides a sufficient shielding effect. Further, where the coating process is performed by such plasma-less ALD, quartz members does not generate Na due to plasma sputtering in forming the coating film, and so the SiN product film formed by the subsequent film formation process is prevented from being contaminated with Na. In addition, where the Si source gas is a chlorine-containing gas, such as DCS gas, thermal ALD results in a higher Cl concentration in the coating film as compared to plasma ALD. Since Cl serves to trap Na in the coating film, the SiN product film formed by the subsequent film formation process is further prevented from being contaminated with Na. Furthermore, the coating film formed by thermal ALD can have a sufficient thickness overall inside the process container 1 to prevent quartz members from generating Na due to plasma sputtering in the subsequent film formation process.

As shown in FIG. 5, this coating process or process 1 is performed by so-called plasma ALD that alternately repeats a step S11 and a step S12. The step 11 is arranged to supply the Si source gas or DCS gas into the process container 1 to adsorb this gas on the inner surface of the process container 1 and so forth. The step 12 is arranged to supply the nitriding gas or $NH_3$ gas not excited by plasma into the process container 1 to nitride the Si source gas adsorbed on the inner surface of the process container 1 and so forth. Purge steps 13a and 13b are interposed between the step 11 and step 12 to remove residual gas from inside the process container 1.

In this coating process, the heating temperature inside the process container 1 is set higher than that of the film formation process or process 2. Specifically, the heating temperature is set to be 550 to 670° C., and preferably to be 590 to 630° C. The other conditions for the steps S11, S12, S13a, and S13b may be set almost the same as those for the step S1, S2, S3a, and S3b of the process 2. Further, the time periods T11 and T12 of these gas supply steps may be set almost the same as the time periods T1 and T2.

However, the time periods T13a and T13b of the purge steps of the coating process may be set shorter than the time periods T3a and T3b of the purge steps of the film formation process. Specifically, the time period T13b of the purge step immediately before the Si source supply is set to be 1 to 5 sec. The time period T13a of the purge step immediately after the Si source supply is set to be 1 to 10 sec. T13b/T3b is set to be 0.2 to 1, and preferably to be 0.2 to 0.6. T13a/T3a is set to be 0.1 to 1, and preferably to be 0.14 to 0.57. T13b/T13a is set to be 0.1 to 5, and preferably to be 0.4 to 0.7. Where the conditions are set as described above, the Cl concentration in the coating film can be controlled to be an optimum concentration for trapping Na.

Next, explanations will be given of experiments conducted in the apparatus shown in FIG. 1 to confirm some effects of the embodiment.

The quartz wafer boat 5 without wafers placed thereon was mounted on the quartz heat-insulating cylinder 7, and was loaded into the quartz process container 1. Then, the process container 1 was airtightly closed, and a cleaning process using HF gas was performed in the process container 1. Then, coating processes of different four types were respectively performed by plasma ALD (comparative example CE1), thermal CVD (comparative example CE2), thermal ALD (present example PE1), and short thermal ALD with shorter purge time (present example PE2).

In the plasma ALD (comparative example CE1) and thermal ALD (present example PE1), the purge step before the Si flow was set at 3 sec., and the purge step after the Si flow was set at 7 sec. (the difference between CE1 and PE1 resided in plasma ON and OFF). In the short thermal ALD (present example PE2), the purge step before the Si flow was set at 1 sec., and the purge step after the Si flow was set at 3 sec.

Commonly to the coating processes of different four types (CE1, CE2, PE1, and PE2), DCS gas was used as the Si source gas, $NH_3$ gas was used as the nitrogen-containing gas, and $N_2$ gas was used as the purge gas. The flow rates of the DCS gas, $NH_3$ gas, and $N_2$ gas were set at 1 to 2 L/min (slm) for DCS, 1 to 10 L/min (slm) for $NH_3$, and 0.5 to 5 L/min (slm) for $N_2$, respectively. The temperature inside the process container was set at 630° C. The pressure inside the process container was set to be 13.33 to 666.5 Pa.

After each of the coating processes of different four types, the wafer boat with 100 wafers placed thereon was mounted on the heat-insulating cylinder 7, and was loaded into the process container 1. Then, the process container 1 was airtightly closed, and a film formation process was performed by plasma ALD in the process container 1 to form an SiN film (product film). This film formation process was performed under essentially the same conditions as those for the plasma ALD coating process described above, except that the film formation temperature was set at 550 to 630° C. Then, the Na content in each SiN product film thus formed was measured by an IPC mass spectroscope for wafers at the top and bottom of the wafer boat.

Figure 6:
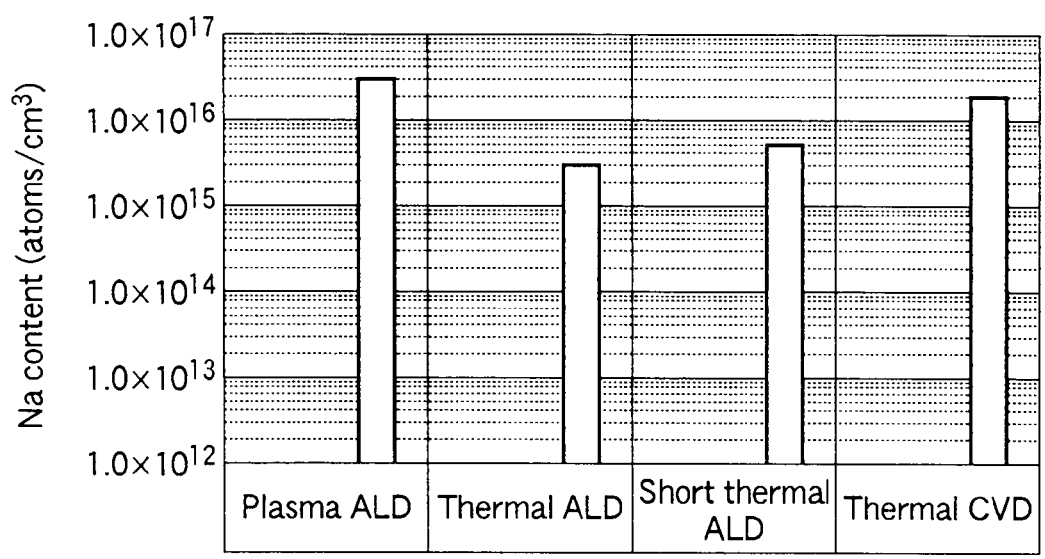
FIG. 6 is a graph showing the Na content in SiN product films on the bottom wafer obtained by an experiment where coating processes were respectively performed by plasma ALD, thermal CVD, thermal ALD, and short thermal ALD, and then the SiN product films were formed on wafers by plasma ALD.

FIG. 6 is a graph showing the Na content in SiN product films on the bottom wafer obtained by this experiment where coating processes were respectively performed by plasma ALD, thermal CVD, thermal ALD, and short thermal ALD, and then the SiN product films were formed on wafers by plasma ALD. As shown in FIG. 6, in the case of using the plasma ALD coating process (comparative example CE1), the Na content in the SiN product film was high and exceeded $1.0 \times 10^{16}$ [atoms/cm$^3$]. In the case of using the thermal CVD coating process (comparative example CE2), the Na content in the SiN product film was high and exceeded $1.0 \times 10^{16}$ [atoms/cm$^3$]. On the other hand, in each of the cases of using the thermal ALD and short thermal ALD coating processes (present examples PE1 and PE2), the Na content in the SiN product film was low and below $1.0 \times 10^{16}$ [atoms/cm$^3$]. Accordingly, it was confirmed that the present examples PE1 and PE2 caused the Na content in the SiN product film to be lower as a whole, as compared to the comparative examples CE1 and CE2.

Figure 7:
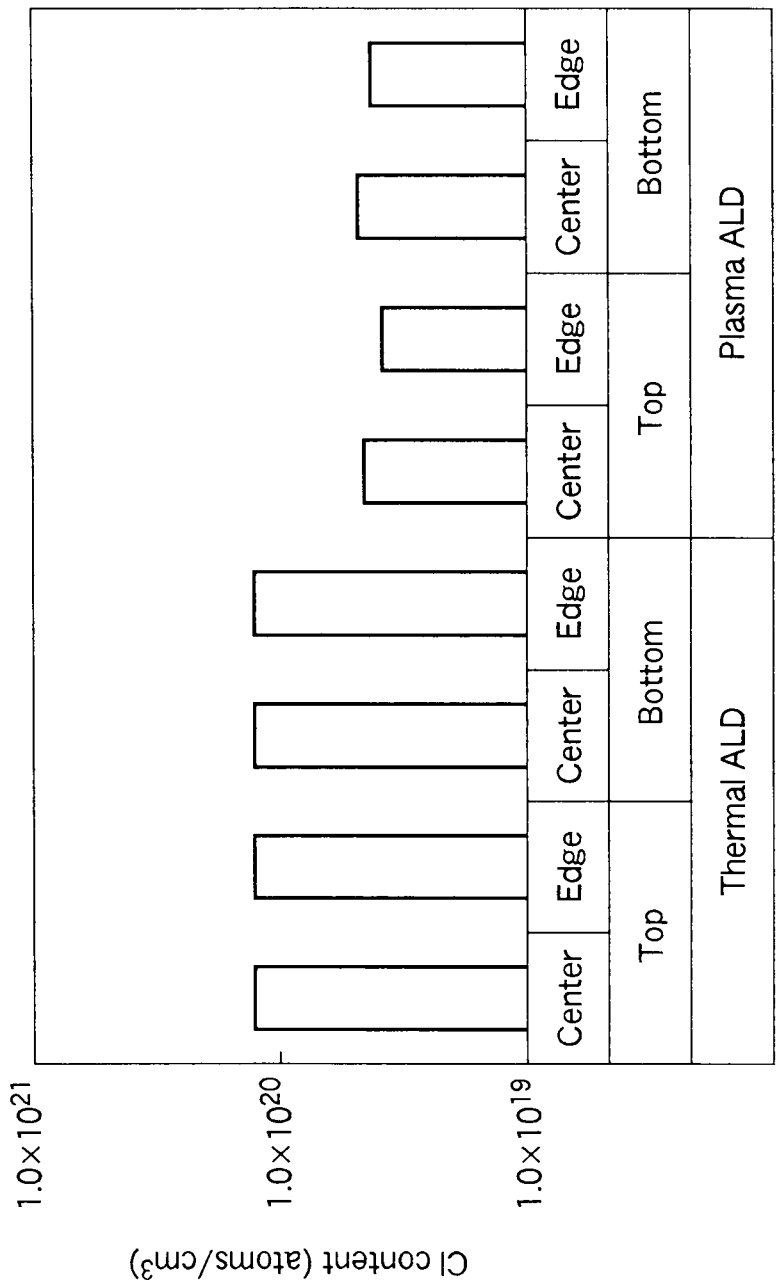
FIG. 7 is a graph showing the Cl content in SiN films formed by plasma ALD and thermal ALD.

Further, SiN films were formed by plasma ALD and thermal ALD using DSC as the Si source gas and the Cl content in the films was measured by the IPC mass spectroscope. FIG. 7 is a graph showing the Cl content in SiN films formed by plasma ALD and thermal ALD. As shown in FIG. 7, depending on the presence and absence of plasma, the Cl concentration clearly shows a significant difference. Since a film formed by thermal ALD has a higher Cl concentration, it is expected that the Na trapping effect of Cl be enhanced by performing the coating process by thermal ALD.

The present invention is not limited to the embodiment described above, and it may be modified in various manners. For example, in the embodiment described above, a silicon nitride film is formed by use of an Si source gas and a nitrogen-containing gas. Alternatively, the present invention may be applied to a process for forming another thin film, such as a silicon oxide film or silicon oxynitride film, by plasma ALD using first and second process gases while turning at least one of the gases into plasma.

In the embodiment described above, the process container inner surface, wafer boat (holder member), and heat-insulating cylinder are covered with a coating film. However, it suffices that only the process container inner surface is covered with a coating film. In the embodiment described above, the plasma generation mechanism is integrally disposed on the process container. Alternatively, the present invention may be applied to a remote plasma apparatus equipped with a plasma generation mechanism disposed separately from the process container to turn a gas into plasma outside the process container before supplying the gas into the process container.

In the embodiment described above, the DCS gas and $NH_3$ gas are completely alternately supplied. However, they do not necessarily need to be completely alternately supplied, such that the $NH_3$ gas is also supplied while the DCS gas is supplied.

The target object is not limited to a semiconductor wafer, and the present invention may be applied to another substrate, such as an LCD glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for using a vertical film formation apparatus for forming a silicon nitride film, the film formation apparatus comprising a vertical process container configured to hold a vacuum state therein, the process container including an inner surface made of quartz, from which Na can be released as a contaminant, a holder configured to hold a plurality of target objects at intervals in a vertical direction inside a process container, a heater disposed around the process container to heat the target objects, a first process gas supply system configured to supply a Si source gas containing Si and Cl into the process container, the first process gas supply system including a first nozzle extending vertically with a plurality of gas spouting holes formed thereon to spout the Si source gas in horizontal directions, a second process gas supply system configured to supply a ammonia gas into the process container, the second process gas supply system including a second nozzle extending vertically with a plurality of gas spouting holes formed thereon to spout the ammonia gas in horizontal directions, a plasma generation system attached to the process container and configured to turn into plasma the ammonia gas spouted from the second nozzle, and an exhaust system configured to exhaust gas from inside the process container, the method comprising:

performing a coating process inside the process container without product target objects present therein to cover the inner surface of the process container with a coating film, then, performing a film formation process inside the process container accommodating the holder with the product target objects placed thereon to form the silicon nitride film on the product target objects, the coating process and the film formation process respectively forming the coating film and the silicon nitride film to have a predetermined thickness by repeating a cycle a plurality of times to laminate thin films respectively formed by the plurality of times, the cycle comprising:

a first supply step of supplying the Si source gas into the process container by spouting the Si source gas from the first nozzle without supplying the ammonia gas into the process container, thereby forming an adsorbed layer derived from the Si source gas;

then a first purge step of exhausting gas from inside the process container without supplying either of the Si source gas or the ammonia gas into the process container;

then an second supply step of supplying the ammonia gas into the process container by spouting the ammonia gas from the second nozzle without supplying the Si source gas into the process container, thereby nitriding the adsorbed layer; and then a second purge step of exhausting gas from inside the process container without supplying either of the Si source gas and the ammonia gas into the process container, wherein the coating process forms the coating film in a thermal atomic layer deposition (ALD) manner by setting the process container at a coating temperature during the cycle, and supplying the Si source gas and the ammonia gas into the process container without turning either of the Si source gas and the ammonia gas into plasma, wherein the film formation process forms the silicon nitride film in a plasma ALD manner by setting the process container at a film formation temperature lower than the coating temperature during the cycle, in which the first supply step is a step of supplying the Si source gas into the process container without turning the Si source gas into plasma, and the second supply step is a step of supplying the ammonia gas into the process container while turning the ammonia gas into plasma by the plasma generating system, and wherein the coating process uses conditions to control concentration of chlorine in the coating film, the chlorine being derived from the Si source gas and serving to trap the Na, such that the conditions include time periods of the first and second purge steps of the coating process set to be respectively shorter than time periods of the first and second purge steps of the film formation process.

2. The method according to claim 1, wherein the coating temperature is a temperature of 550 to 670° C., and the film formation temperature is a temperature of 350 to 650° C.

3. The method according to claim 1, wherein the coating process is performed inside the process container accommodating the holder without the product target object placed thereon, to cover a surface of the holder with the coating film.

4. The method according to claim 1, wherein, before the coating process, the method further comprises performing a cleaning process inside the process container without the product target objects present therein to remove a reaction product deposited on the inner surface of the process container, by supplying a cleaning gas while exhausting gas from inside the process container.

5. The method according to claim 4, wherein the cleaning gas is a fluorine-containing gas.

6. The method according to claim 5, wherein the cleaning process includes setting temperature inside the process container at a cleaning temperature of 300 to 500° C.

7. The method according to claim 1, wherein the conditions include a ratio of T13$a$/T3$a$ set at a value within a range of 0.14 to 0.57, where T3$a$ and T13$a$ are time periods of the first purge step of the film formation process and the coating process, respectively.

8. The method according to claim 7, wherein the conditions include a ratio of T13$b$/T3$b$ set at a value within a range of 0.2 to 0.6 where T3$b$ and T13$b$ are time periods of the second purge step of the film formation process and the coating process, respectively.

9. The method according to claim 1, wherein the Si source gas is selected from the group consisting of dichlorosilane, monochlorosilane, hexachlorodisilane, and tetrachlorosilane.

10. The method according to claim 2, wherein the coating temperature is a temperature of 590 to 630° C.

11. The method according to claim 2, wherein the first and second supply steps of the film formation process set the process container at a pressure of 66.65 to 666.5 Pa and a pressure of 13.33 to 266.6 Pa therein, respectively.

12. The method according to claim 8, wherein the conditions include a ratio of T13$b$/T13$a$ set at a value within a range of 0.4 to 0.7.

13. The method according to claim 1, wherein, in both of the film formation process and the coating process, the first and second purge steps include supplying an inactive gas into the process container.

* * * * *